(12) United States Patent
Yoshida et al.

(10) Patent No.: US 12,110,194 B2
(45) Date of Patent: Oct. 8, 2024

(54) ROBOT CONTROL DEVICE, ROBOT, AND METHOD OF CONTROLLING THE ROBOT

(71) Applicant: Kawasaki Jukogyo Kabushiki Kaisha, Kobe (JP)

(72) Inventors: Masaya Yoshida, Kobe (JP); Shinya Kitano, Kobe (JP); Atsushi Nakaya, Kobe (JP); Junichi Sugahara, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 435 days.

(21) Appl. No.: 17/632,506

(22) PCT Filed: Jul. 9, 2020

(86) PCT No.: PCT/JP2020/026871
§ 371 (c)(1),
(2) Date: Feb. 3, 2022

(87) PCT Pub. No.: WO2021/029168
PCT Pub. Date: Feb. 18, 2021

(65) Prior Publication Data
US 2022/0281694 A1 Sep. 8, 2022

(30) Foreign Application Priority Data
Aug. 9, 2019 (JP) .................. 2019-147174

(51) Int. Cl.
*B25J 9/16* (2006.01)
*B65G 47/90* (2006.01)

(52) U.S. Cl.
CPC .......... *B65G 47/905* (2013.01); *B25J 9/1664* (2013.01)

(58) Field of Classification Search
CPC ..... B25J 9/1664; B25J 9/1679; H01L 21/677; B65G 47/905; G05B 2219/45031
See application file for complete search history.

(56) References Cited

U.S. PATENT DOCUMENTS

| 11,158,079 B2 * | 10/2021 | Kwon ...................... G06T 7/11 |
| 2007/0285673 A1 | 12/2007 | Kiley et al. |

(Continued)

FOREIGN PATENT DOCUMENTS

| JP | 2004-207279 A | 7/2004 |
| JP | 2005-310858 A | 11/2005 |

(Continued)

OTHER PUBLICATIONS

Jeong et al., Development of a direct teaching system for a cooperative cell-production robot considering safety and operability, 2009, IEEE, p. 5339-5344 (Year: 2009).*

(Continued)

*Primary Examiner* — Mcdieunel Marc
(74) *Attorney, Agent, or Firm* — XSENSUS LLP

(57) ABSTRACT

A robot control device configured to control operation of a robot configured to transfer a substrate while holding the substrate is provided. The substrate becomes in a first state where an end effector holds the substrate and the substrate is not placed at an installation position, when the end effector positions at a first teaching point above the installation position. The substrate becomes in a second state where the end effector does not hold the substrate and the substrate is placed at the installation position, when the end effector positions at a second teaching point below the installation position. The first and second states can be switched by causing the robot to perform a first operation to move the end effector from either one of the first teaching (Continued)

point and the second teaching point to the other one of the first teaching point and the second teaching point.

6 Claims, 8 Drawing Sheets

(56) References Cited

U.S. PATENT DOCUMENTS

| | | |
|---|---|---|
| 2009/0093908 A1 | 4/2009 | Hashimoto et al. |
| 2017/0040203 A1 | 2/2017 | Caveney et al. |
| 2020/0083070 A1* | 3/2020 | Clark ................ H01L 21/76834 |
| 2020/0167946 A1* | 5/2020 | Kwon .................. G06T 7/0006 |
| 2022/0384147 A1* | 12/2022 | Lee .................. H01J 37/32027 |

FOREIGN PATENT DOCUMENTS

| | | |
|---|---|---|
| JP | 2008-227199 A | 9/2008 |
| JP | 2009-90406 A | 4/2009 |
| JP | 2009-529248 A | 8/2009 |
| JP | 2017-505994 A | 2/2017 |

OTHER PUBLICATIONS

Fudaba et al., Teaching data characteristics for direct teaching using a robot with a dual-shell structure, 2012, IEEE, p. 81-87 (Year: 2012).*

Yshida et al., High-speed force controller for SCARA robots, 1989, IEEE, p. 629-633 (Year: 1989).*

Nakamura et al., Robot autonomous error calibration method for off line programming system, 1995, IEEE, p. 1775-1782 (Year: 1995).*

* cited by examiner

ROBOT CONTROL DEVICE, ROBOT, AND METHOD OF CONTROLLING THE ROBOT

CROSS-REFERENCE TO RELATED APPLICATIONS

The present application is based on PCT filing PCT/JP2020/026871, filed Jul. 9, 2020, which claims priority to JP 2019-147174, filed Aug. 9, 2019, the entire contents of each are incorporated herein by reference.

TECHNICAL FIELD

The present disclosure relates to a robot control device, a robot, and a method of controlling the robot.

BACKGROUND ART

Conventionally, robot control devices for controlling operation of a robot which transfers a substrate while holding the substrate, are known. Patent Document 1 discloses a substrate transferring device as one example of such robot control devices.

The substrate transferring device of Patent Document 1 is provided with a housing, and a robotic arm provided to an upper surface of the housing. The robotic arm is provided with an upper arm attached to the upper surface of the housing, a forearm attached to a tip end of the upper arm, and an end effector attached to a tip end of the forearm. Moreover, a substrate aligner is provided with a base part, a substrate holding part attached to the base part, and a sensor which detects a characteristic part (e.g., a notch) of the substrate. The base part and the substrate holding part of the substrate aligner, and the substrate held by the substrate holding part pass through substrate holding teeth of the end effector.

REFERENCE DOCUMENT OF CONVENTIONAL ART

Patent Document

[Patent Document 1] JP2017-505994A

DESCRIPTION OF THE DISCLOSURE

Problem to be Solved by the Disclosure

The conventional robot control device as disclosed in Patent Document 1, generally determines whether the end effector passes an installation position at which the substrate is placed. However, the transferring the substrate while holding may not promptly be performed because of the conduction of the determination.

Therefore, one purpose of the present disclosure is to provide a robot control device, a robot, and a method of controlling the robot, capable of promptly transferring a substrate while holding the substrate.

SUMMARY OF THE DISCLOSURE

In order to solve the problem, a robot control device according to the present disclosure is a robot control device configured to control operation of a robot configured to transfer a substrate while holding the substrate. The robot includes a robotic arm having at least one joint axis, and an end effector provided to a tip end of the robotic arm and configured to hold the substrate, and the robot is disposed adjacent to an installation position at which the substrate is placed. The substrate becomes in a first state where the end effector holds the substrate and the substrate is not placed at the installation position, when the end effector positions at a first teaching point above the installation position. The substrate becomes in a second state where the end effector does not hold the substrate and the substrate is placed at the installation position, when the end effector positions at a second teaching point below the installation position. The robot control device switches between the first state and the second state by causing the robot to perform a first operation to move the end effector from either one of the first teaching point and the second teaching point to the other one of the first teaching point and the second teaching point. During the first operation, the robot control device is inhibited to determine whether the end effector passes the installation position, and to stop the end effector.

According to this configuration, the robot control device according to the present disclosure does not determine whether the end effector passes the installation position, and does not stop the end effector, during the first operation. As a result, the robot control device according to the present disclosure can promptly transfer the substrate while holding the substrate.

In order to solve the problem, a robot control method according to the present disclosure is a method for controlling operation of a robot configured to transfer a substrate while holding the substrate. The robot includes a robotic arm having at least one joint axis, and an end effector provided to a tip end of the robotic arm and configured to hold the substrate. The robot is disposed adjacent to an installation position at which the substrate is placed. The substrate becomes in a first state where the end effector holds the substrate and the substrate is not placed at the installation position, when the end effector positions at a first teaching point above the installation position. The substrate becomes in a second state where the end effector does not hold the substrate and the substrate is placed at the installation position, when the end effector positions at a second teaching point below the installation position. The method includes the steps of positioning the end effector at either one of the first teaching point and the second teaching point (First Step), and then switching between the first state and the second state by causing the robot to perform the first operation to move the end effector from the one of the first teaching point and the second teaching point to the other one of the first teaching point and the second teaching point, and not determining whether the end effector passes the installation position, and not stopping the end effector during the first operation (Second Step).

According to this configuration, the robot control method according to the present disclosure does not include determining whether the end effector passes the installation position, or stopping the end effector during the first operation. As a result, the robot control method according to the present disclosure can promptly transfer the substrate while holding the substrate.

Effect of the Disclosure

According to the present disclosure, a robot control device, a robot, and a method of controlling the robot, capable of promptly transferring a substrate while holding the substrate can be provided.

BRIEF DESCRIPTION OF DRAWINGS

FIG. 3(A) is a view when an end effector is located at a first teaching point, and FIG. 3(B) is a view when the end effector is located at a second teaching point.

FIG. 5(A) is a view when the end effector is located at the second teaching point, and FIG. 5(B) is a view when the end effector is located at the second teaching point.

FIG. 8(A) is a view when the end effector is located at the first teaching point, and FIG. 8(B) is a view when the end effector is located at the second teaching point.

MODE FOR CARRYING OUT THE DISCLOSURE

Figure 1:
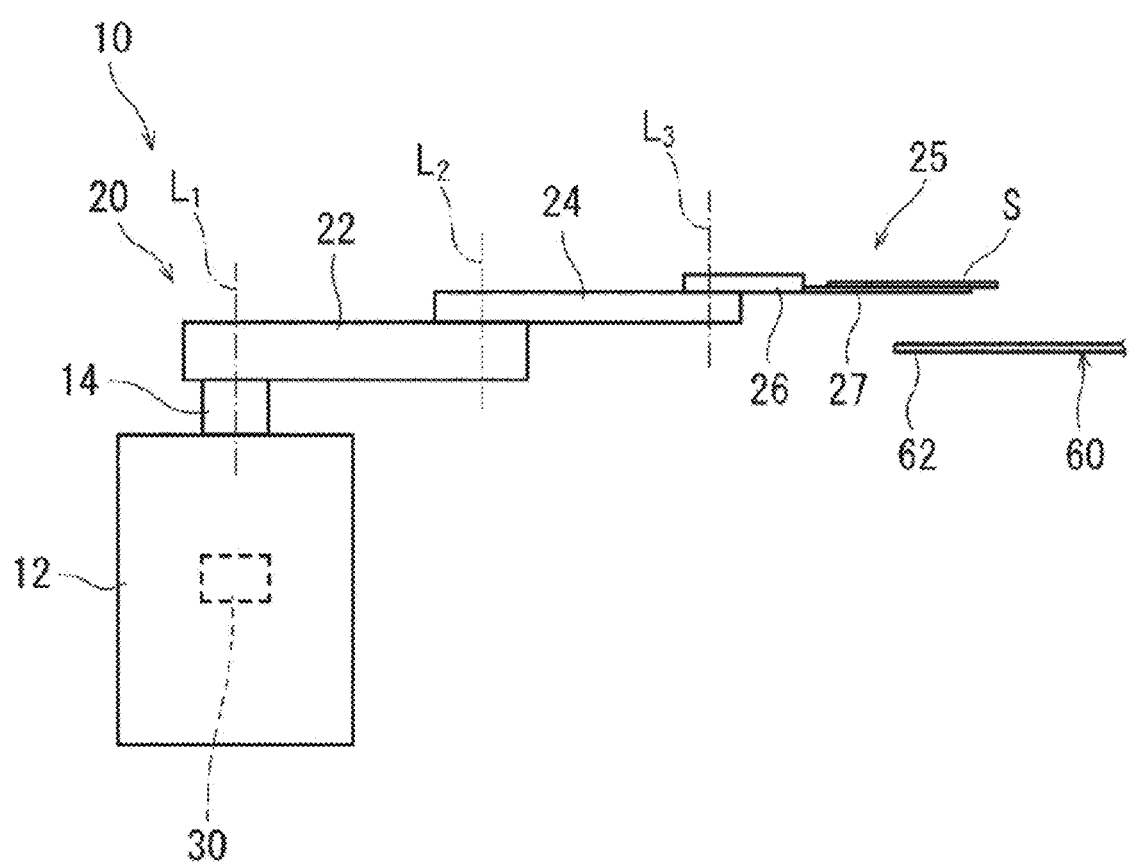
FIG. 1 is a schematic view illustrating the entire configuration of a robot according to one embodiment of the present disclosure.

Hereinafter, a robot control device, a robot, and a method of controlling the robot according to one embodiment of the present disclosure, are described with reference to the drawings. Note that the present disclosure is not limited by this embodiment. Further, below, throughout the drawings, the same reference characters are given to the same or corresponding elements to omit redundant description.

(Robot 10)

FIG. 1 is a schematic view illustrating the entire configuration of a robot according to this embodiment. As illustrated in FIG. 1, a robot 10 according to this embodiment is configured as a horizontal articulated robot which transfers a substrate S while holding the substrate S, and is disposed adjacent to an installation position 62 at which the substrate S is placed. The robot 10 is provided with a pedestal 12, an elevating shaft 14 provided to the pedestal 12 to be expandable and contractible in the up-and-down direction, a robotic arm 20 provided to an upper end of the elevating shaft 14, and an end effector 25 provided to a tip end of the robotic arm. The robot 10 further includes a robot control device 30 which controls operation of the robotic arm and the end effector 25.

(Elevating Shaft 14 and Robotic Arm 20)

The elevating shaft 14 is configured to be expendable and contractible in the up-and-down direction by a ball-screw mechanism etc. (not illustrated), and this ascending-and-descending operation is performed by a servomotor 14a (see FIG. 2) provided inside the pedestal 12. Moreover, the elevating shaft 14 is provided to the pedestal 12 so as to be rotatable about a rotation axis $L_1$ extending in the vertical direction, and this rotating operation is performed by a servomotor 14b (same as above) provided inside the pedestal 12.

The robotic arm 20 has a first link 22 and a second link 24, each comprised of an elongated member extending horizontally.

The first link 22 is attached, at its base end in the longitudinal direction, to the upper end of the elevating shaft 14. The first link 22 ascends and descends integrally with the elevating shaft 14, and rotates about the rotation axis $L_1$ integrally with the elevating shaft 14.

The second link 24 is attached, at its base end in the longitudinal direction, to a tip end of the first link 22 in the longitudinal direction so as to be rotatable about a rotation axis $L_2$ extending in the vertical direction. The rotating operation of the second link 24 with respect to the first link 22 is performed by a servomotor 24a (see FIG. 2) provided inside the first link 22.

(End Effector 25)

The end effector 25 is provided with a wrist part 26 attached, at its base end in the longitudinal direction, to a tip end of the second link 24 in the longitudinal direction so as to be rotatable about a rotation axis $L_3$ extending in the vertical direction, and a base body 27 which is provided to a tip end of the wrist part 26 and operates integrally with the wrist part 26.

The rotating operation of the wrist part 26 with respect to the second link 24 is performed by the servomotor 24a (see FIG. 2) provided inside the second link 24.

Figure 3:
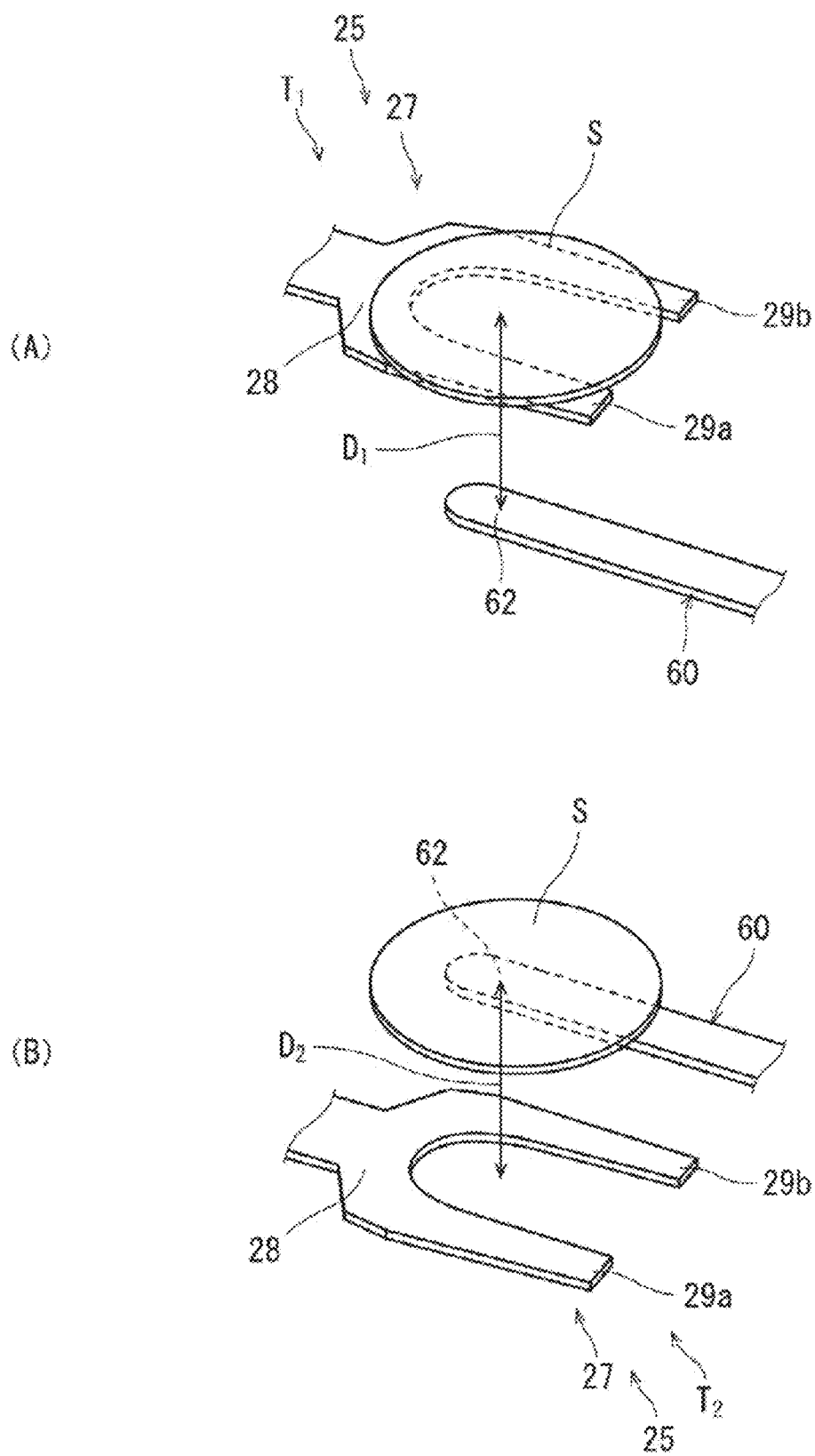
FIGS. 3(A) and 3(B) are schematic views illustrating a situation where the robot according to this embodiment of the present disclosure performs a first operation to place a substrate, where

The base body 27 includes a base-end part 28 (see FIGS. 3(A) and 3(B)) connected to the tip end of the wrist part 26 (tip end of the robotic arm), and two tip-end parts 29a and 29b (same as above) branching from the base-end part 28 and extending to the tip-end side. The tip-end part 29a projects from the tip-end side of one end of the base-end part 28 in the width direction into a plane perpendicular to the thickness direction, and the tip-end part 29b projects from the tip-end side of the other end of the base-end part 28 in the width direction into the plane perpendicular to the thickness direction. The base body 27 has the base-end part 28 and the tip-end parts 29a and 29b, and therefore, it has a Y-shape when seen in the thickness direction.

For example, the end effector 25 may include a movable member (not illustrated) provided to the base-end part 28 so as to be reciprocatable on the center line of the end effector 25, and fixed members (same as above) provided to the tip-end parts 29a and 29b, respectively. Further, for example, the end effector 25 may move the movable member toward the tip end of the center line, and may hold the substrate S by pinching the substrate S between the movable member and the fixed members.

(Robot Control Device 30)

Figure 2:
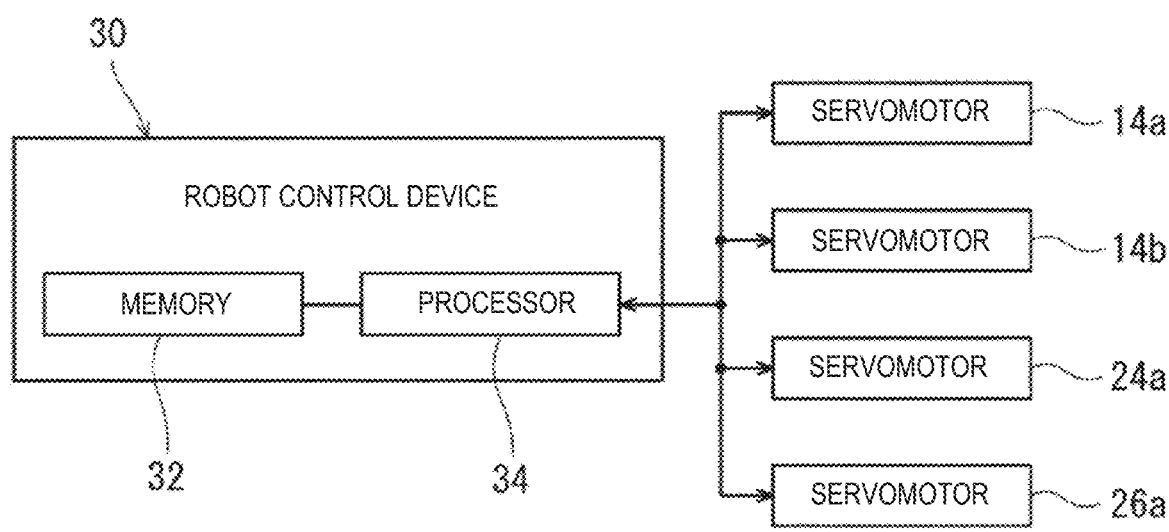
FIG. 2 is a block diagram illustrating a control system of the robot according to this embodiment of the present disclosure.

FIG. 2 is a block diagram illustrating a control system of the robot according to this embodiment. As illustrated in FIG. 2, the robot control device 30 according to this embodiment includes a memory 32 and a processor 34 which executes a program stored in the memory 32. The processor 34 is connected to each of the servomotors 14a, 14b, 24a, and 26a. The robot control device 30 can servo-control the operation of the robot 10 by the servomotors 14a, 14b, 24a, and 26a.

(Installation Position 62)

The installation position 62 is provided at a tip end of a plate member 60 longitudinally extending in the horizontal plane. The plate member 60 is formed in an I-shape, and the dimension thereof is uniform in the width direction including the installation position 62. The dimension in the width direction of the plate member 60 is smaller than a space between the two tip-end parts 29 of the end effector 25.

(Example of Work of Placing Substrate S at Installation Position 62)

Figure 4:
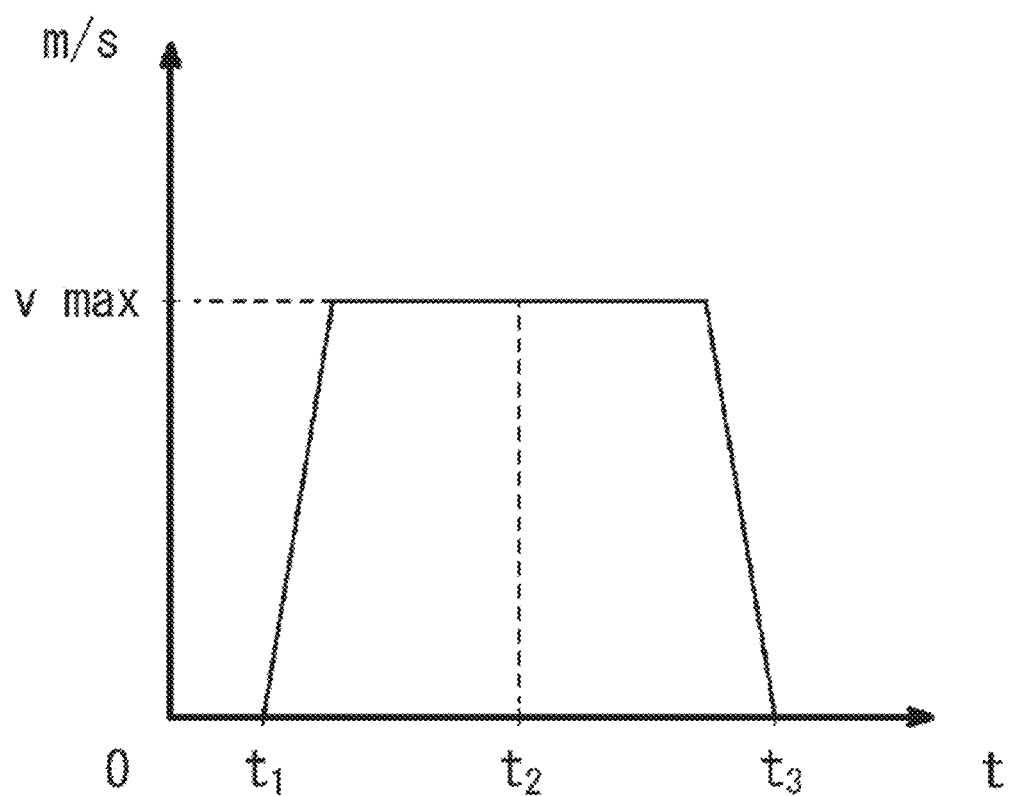
FIG. 4 is a graph illustrating speed of the end effector during the first operation to place the substrate by the robot according to this embodiment of the present disclosure.

One example of work of placing, at the installation position 62, the substrate S held by the end effector 25 is described based on FIGS. 3(A), 3(B), and 4. Further, effects achieved by the robot control device 30 according to this embodiment are also described. FIGS. 3(A) and 3(B) are schematic views illustrating a situation where the robot according to this embodiment performs a first operation to place the substrate, where FIG. 3(A) is a view when the end effector is located at a first teaching point, and FIG. 3(B) is a view when the end effector is located at a second teaching point.

As illustrated in FIG. 3(A), when the end effector 25 is located at a teaching point $T_1$ (first teaching point) above the installation position 62 (in other words, when the end effector 25 takes the position and posture illustrated in this figure), the substrate S becomes in a first state where the end effector 25 holds the substrate S and the substrate S is not placed at the installation position 62. Moreover, as illustrated in FIG. 3(B), when the end effector 25 is located at a teaching point $T_2$ (second teaching point) below the installation position 62 (in other words, when the end effector 25 takes the position and posture illustrated in this figure), the substrate S becomes in a second state where the end effector 25 does not hold the substrate S and the substrate S is placed at the installation position 62.

By the robot control device 30 causing the robot 10 to move the end effector 25 from the teaching point $T_1$ to the teaching point $T_2$ (hereinafter, referred to as a "first operation to place the substrate S"), the robot control device 30 can switch from the first state to the second state.

Here, the teaching points $T_1$ and $T_2$ are set such that the installation position 62 passes through between the two tip-end parts 29a and 29b of the end effector 25, when the end effector 25 passes the installation position 62 during the first operation to place the substrate S. Therefore, the robot 10 according to this embodiment can certainly transfer the substrate S while holding it (here, the work of placing the substrate S held by the end effector 25, at the installation position 62) with the simple structure.

Note that the robot control device 30 may store the positional information on the installation position 62 beforehand by teaching, and derive the teaching point $T_1$ based on a distance $D_1$ from the installation position 62. Similarly, the robot control device 30 may store the positional information on the installation position 62 beforehand by teaching, and derive the teaching point $T_2$ based on a distance $D_2$ from the installation position 62. The distances $D_1$ and $D_2$ may be equal to each other.

Note that, the robot control device 30 may move the movable member toward the tip end of the center line so that the end effector 25 holds the substrate S by pinching the substrate S between the movable member and the fixed members until the end effector 25 reaches the teaching point $T_1$. Then, when the end effector 25 reaches the teaching point $T_1$, the robot control device 30 may move the movable member toward the base end of the center line so that the substrate S is placed on the end effector 25 without being pinched between the movable member and the fixed members (i.e., the substrate S may only be placed thereon).

FIG. 4 is a graph illustrating speed of the end effector during the first operation of the robot to place the substrate according to this embodiment. In FIG. 4, the horizontal axis indicates a time (t), and the vertical axis indicates a speed (m/s). As illustrated in FIG. 4, the end effector 25 takes the position and posture at the teaching point $T_1$ at a time $t_1$, and then starts to move toward the teaching point $T_2$. Then, the end effector 25 passes the installation position 62 at a time $t_2$ while moving at a maximum speed $v_{max}$, and takes the position and posture at the teaching point $T_2$ at a time $t_3$.

During the first operation to place the substrate S, the robot control device 30 does not determine whether the end effector 25 passes the installation position 62, or stop the end effector 25. Therefore, the robot control device 30 according to this embodiment can promptly transfer the substrate S while holding it.

Moreover, the robot control device 30 does not decelerate the end effector 25 at or near the installation position 62 during the first operation to place the substrate S. Therefore, the robot control device 30 according to this embodiment can further promptly transfer the substrate S while holding it (same as above).

(Example of Work of Holding Substrate S Placed at Installation Position 62)

Figure 5:
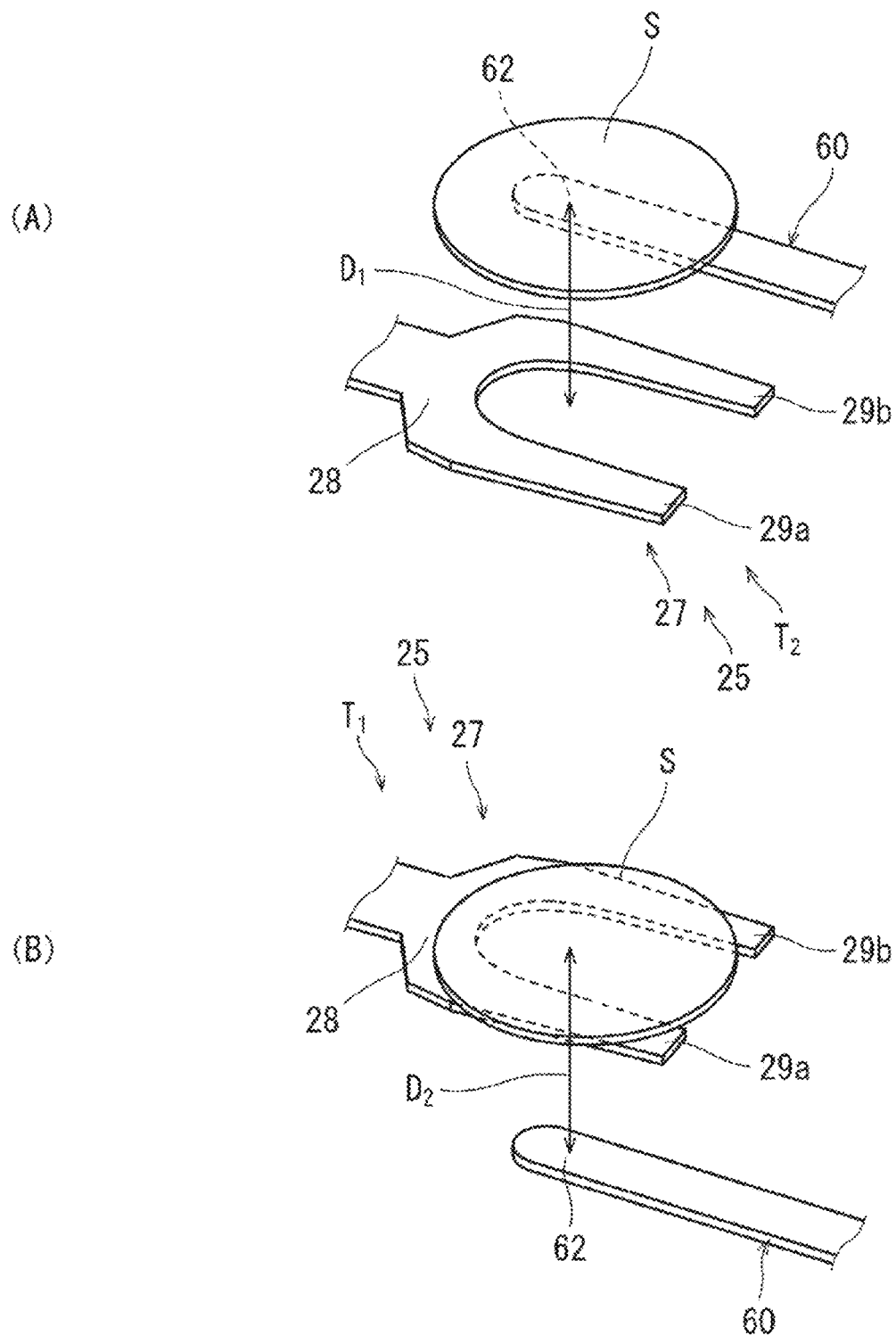
FIGS. 5(A) and 5(B) are schematic views illustrating a situation where the robot according to this embodiment of the present disclosure performs the first operation to hold the substrate, where
Figure 6:
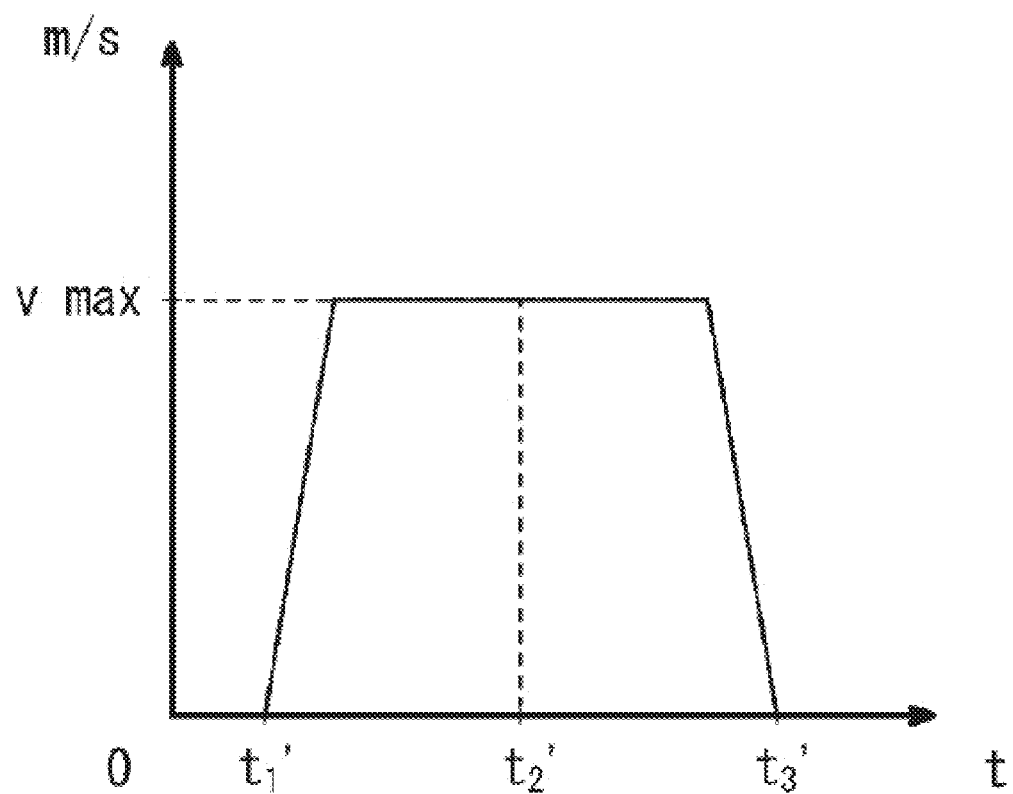
FIG. 6 is a graph illustrating the speed of the end effector during the first operation to hold the substrate by the robot according to this embodiment of the present disclosure.

One example of work of holding by the end effector 25 the substrate S placed at the installation position 62 is described based mainly on FIGS. 5(A), 5(B), and 6. Further, effects achieved by the robot control device 30 according to this embodiment are also described. FIGS. 5(A) and 5(B) are schematic views illustrating a situation where the robot according to this embodiment performs the first operation to hold the substrate, where FIG. 5(A) is a view when the end effector is located at the second teaching point, and FIG. 5(B) is a view when the end effector is located at the second teaching point.

As illustrated in FIGS. 5(A) and 5(B), by the robot control device 30 causing the robot 10 to move the end effector 25 from the teaching point $T_2$ to the teaching point $T_1$ (hereinafter, referred to as a "first operation to hold the substrate S"), the robot control device 30 can switch from the second state to the first state.

FIG. 6 is a graph illustrating the speed of the end effector during the first operation to hold the substrate by the robot according to this embodiment. In FIG. 6, the horizontal axis indicates the time (t), and the vertical axis indicates the speed (m/s). As illustrated in FIG. 6, the end effector 25 takes the position and posture at the teaching point $T_2$ at a time $t_1'$, and then starts to move toward the teaching point $T_1$. Then, the end effector 25 passes the installation position 62 at a time $t_2'$ while moving at the maximum speed $v_{max}$, and takes the position and posture at the teaching point $T_1$ at a time $t_3'$.

During the first operation to hold the substrate S, the robot control device 30 is inhibited to determine whether the end effector 25 passes the installation position 62, and to stop the end effector 25. Therefore, the robot control device 30 according to this embodiment can promptly transfer the substrate S while holding it (here, the work of holding the substrate S placed at the installation position 62, by the end effector 25).

Moreover, the robot control device 30 does not decelerate the end effector 25 at or near the installation position 62 during the first operation to hold the substrate S. Therefore, the robot control device 30 according to this embodiment can further promptly transfer the substrate S while holding it (same as above).

(Method of Controlling Robot)

Figure 7:
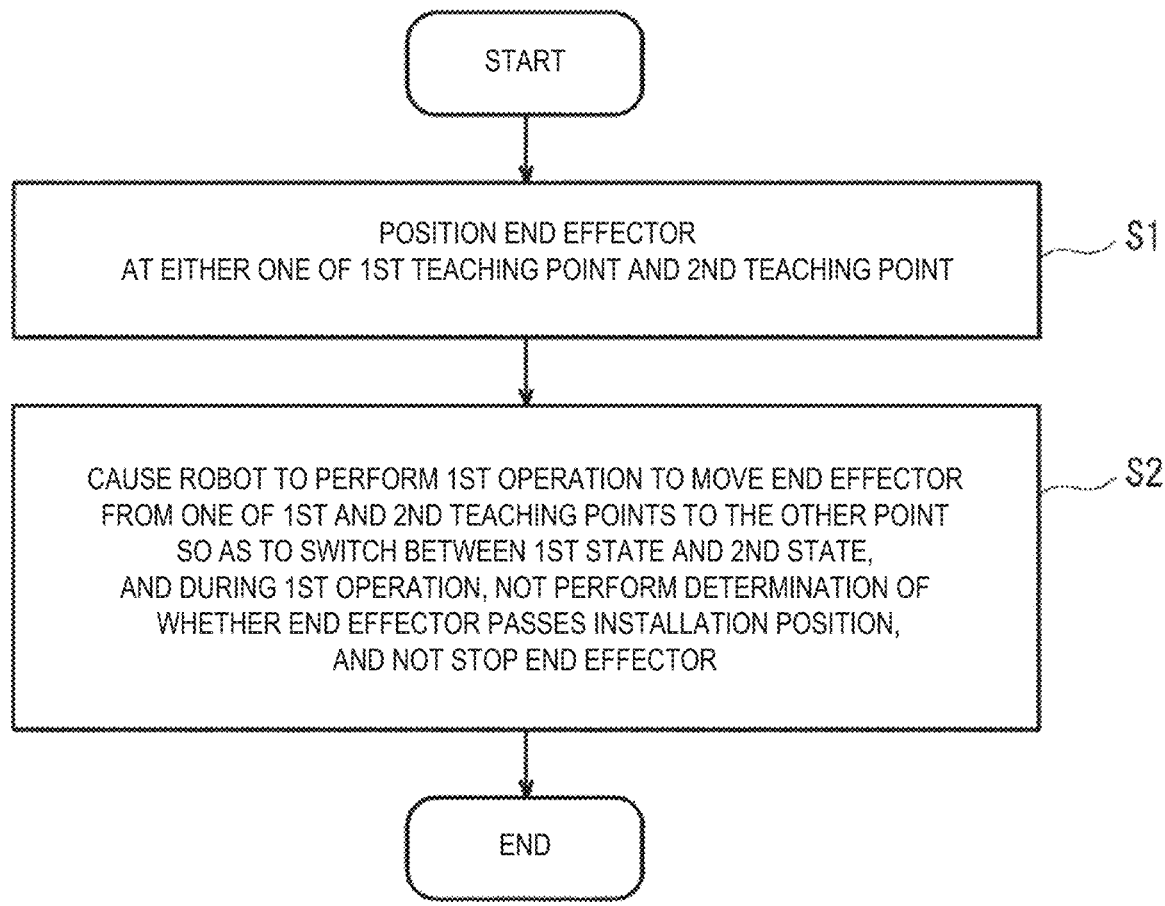
FIG. 7 is a flowchart of a method of controlling the robot according to this embodiment of the present disclosure.

One example of a robot control method for controlling the operation of the robot 10 according to this embodiment is described mainly based on FIG. 7. FIG. 7 is a flowchart of the robot control method according to this embodiment.

As illustrated in FIG. 7, the robot control method according to this embodiment includes Step S1 (First Step) in which the end effector 25 is positioned at either one of the teaching point $T_1$ and the teaching point $T_2$.

Further, the robot control method according to this embodiment includes Step S2 (Second Step) in which, after Step S1, the robot 10 is caused to perform the first operation to move the end effector 25 from the one of the teaching points $T_1$ and $T_2$ to the other one of the teaching points $T_1$ and $T_2$ (in other words, the first operation of the end effector 25 to place the substrate S, or the first operation of the end effector 25 to hold the substrate S) so as to switch between the first state (i.e., the first state where the end effector 25 holds the substrate S, and the substrate S is not placed at the installation position 62) and the second state (i.e., the second state where the end effector does not hold the substrate S, and the substrate S is placed at the installation position 62). During the first operation, it is not determined whether the end effector 25 passes the installation position 62, and the end effector 25 is not stopped.

Since effects achieved by the robot control method according to this embodiment are the same as the robot control device 30 according to the embodiment described above, description thereof is not repeated here.

(Modifications)

It is apparent for a person skilled in the art from the above description that many improvements and other embodiments of the present disclosure are possible. Therefore, the above description is to be interpreted only as illustration, and it is provided in order to teach a person skilled in the art the best mode for implementing the present disclosure. The details of the structures and/or the functions may be substantially changed, without departing from the spirit of the present disclosure.

Figure 8:
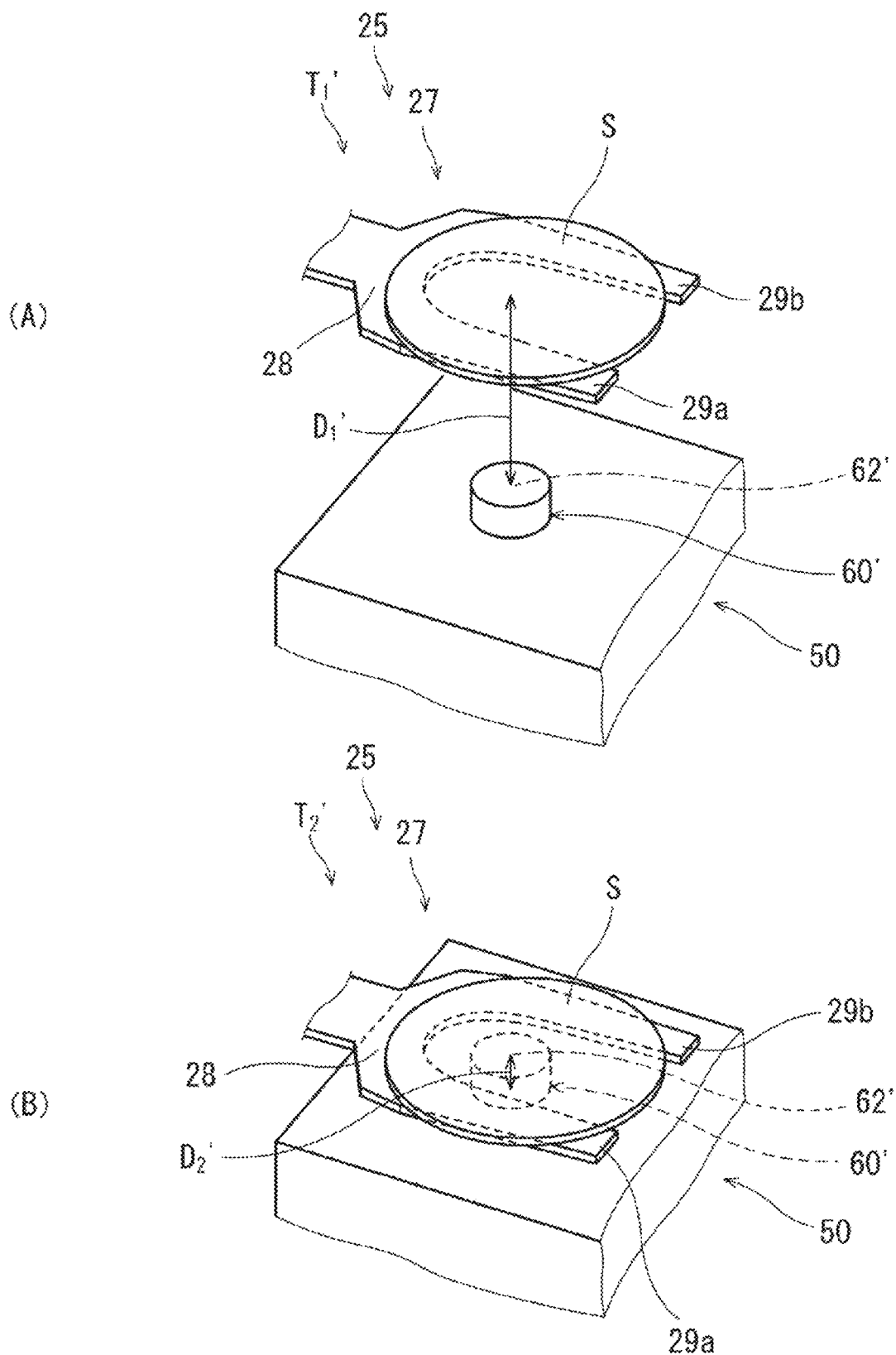
FIGS. 8(A) and 8(B) are schematic views illustrating a situation where a modification of the first operation to place the substrate is performed by the robot according to this embodiment of the present disclosure, where

A modification of the work of placing, at the installation position 62, the substrate S held by the end effector 25 is described based on FIGS. 8(A) and 8(B). FIGS. 8(A) and 8(B) are schematic views illustrating a situation where a modification of the first operation to place the substrate is performed by the robot according to the embodiment described above, where FIG. 8(A) is a view when the end effector is located at the first teaching point, and FIG. 8(B) is a view when the end effector is located at the second teaching point.

As illustrated in FIGS. 8(A) and 8(B), in this modification, the robot 10 according to the above embodiment performs work of placing the substrate S held by the end effector 25, at an installation position 62' of a pre-aligner 50. The pre-aligner 50 is provided so as to align a rotational position of the substrate S.

The pre-aligner 50 is provided with, for example, a turntable 60' on which the substrate S is placed, a driving part (not illustrated) which rotates the turntable 60', a sensor (same as above) which detects a peripheral-edge part of the substrate S being rotated by the driving part, and a processor (same as above) which detects the center position of the substrate S based on the peripheral-edge part of the substrate S detected by the sensor. That is, in this modification, the installation position 62' is an upper surface of the turntable 60'.

As illustrated in FIG. 8(A), when the end effector 25 is positioned at a teaching point $T_1'$ (first teaching point) above the installation position 62' (in other words, when the end effector 25 takes the position and posture illustrated in this figure), the substrate S becomes in the first state where the substrate S is held by the end effector 25, and it is not placed at the installation position 62'. Further, as illustrated in FIG. 8(B), when the end effector 25 is positioned at a teaching point $T_2'$ (second teaching point) below the installation position 62' (in other words, when the end effector 25 takes the position and posture illustrated in this figure), the substrate S becomes in the second state where the substrate S is not held by the end effector 25, and it is placed at the installation position 62'.

Similarly to the embodiment described above, by the robot control device 30 causing the robot 10 to move the end effector 25 from the teaching point $T_1'$ to the teaching point $T_2'$ (first operation), the first state can be switched to the second state.

Note that the robot control device 30 may store the positional information on the installation position 62' beforehand by teaching, and derive the teaching point $T_1'$ based on a distance $D_1'$ from the installation position 62'. Similarly, the robot control device 30 may store the positional information on the installation position 62' beforehand by teaching, and derive the teaching point $T_2'$ based on a distance $D_2'$ from the installation position 62'.

The case where the robot control device 30 causes the robot 10 to move the end effector 25 from the teaching point $T_2'$ to the teaching point $T_1'$ (first operation) is similar to the embodiment described above, and thereby, description thereof is not repeated here.

(Other Modifications)

In the embodiment described above, the robot control device 30 stores the positional information on the installation position 62 beforehand by teaching, derives the teaching point $T_1$ based on the distance $D_1$ from the installation position 62, and derives the teaching point $T_2$ based on the distance $D_2$ from the installation position 62. However, it is not limited to the case, but the robot control device 30 may store the teaching points $T_1$ and $T_2$ beforehand by teaching. Alternatively, the robot control device 30 may store beforehand either one of the teaching points $T_1$ and $T_2$ by teaching, and derive the other one based on the distance from the installation position 62. That is, the robot control device 30 may derive at least one of the teaching points $T_1$ and $T_2$ based on the distance from the installation position 62.

In the embodiment described above, the robot control device 30 does not decelerate the end effector 25 at or near the installation position 62 during the first operation to place the substrate S and the first operation to hold the substrate S. However, it is not limited to the case, but the robot control device 30 may decelerate the end effector 25 at or near the installation position 62 during the first operation to place the substrate S and the first operation to hold the substrate S, within a range where the work of transferring the substrate S while holding it is possible.

In the embodiment described above, the end effector 25 holds the substrate S by pinching it between the movable member (not illustrated), which is provided to the base-end part 28 so as to be reciprocatable on the center line of the end effector 25, and the fixed members (same as above), which are provided to the tip-end parts 29a and 29b, respectively. However, it is not limited to the case, but the end effector 25 may hold the substrate S by placing the substrate S on the end effector 25 or sucking the substrate S.

In the embodiment described above, the base body 27 has a Y-shape when seen in the thickness direction. However, it is not limited to the case, but the base body 27 may have a quadrangular shape. Note that when the base body 27 has such a quadrangular shape, the teaching points $T_1$ and $T_2$ may be set such that, for example, the tip end of the base body 27 is brought to be adjacent to the tip end of the plate member 60 when the end effector 25 passes the installation position 62 during the first operation to place the substrate S and during the first operation to hold the substrate S. Note that the base body 27 may have a polygonal shape other than a quadrangular shape, a circular shape, or other shapes when seen in the thickness direction.

In the embodiment described above, the robot 10 is configured as a horizontal articulated robot having three joint axes. However, it is not limited to the case, but the robot 10 may have one, two, or more than four joint axes (i.e., at least one joint axis). Moreover, the robot 10 may be configured as, for example, a vertical articulated robot, or other robots.

In the embodiment described above, the substrate S has a circular plate shape. However, it is not limited to the case, but the substrate S may have a rectangular shape when seen in the thickness direction, or other shapes.

The robot control device according to the present disclosure is the robot control device configured to control operation of the robot configured to transfer the substrate while holding the substrate. The robot includes the robotic arm having at least one joint axis, and the end effector provided to the tip end of the robotic arm and configured to hold the substrate. The robot is disposed adjacent to the installation position at which the substrate is placed. The substrate becomes in the first state where the end effector holds the substrate and the substrate is not placed at the installation position, when the end effector positions at the first teaching point above the installation position. The substrate becomes in the second state where the end effector does not hold the substrate and the substrate is placed at the installation position, when the end effector positions at the second teaching point below the installation position. The first state and the second state can be switched by causing the robot to perform the first operation to move the end effector from either one of the first teaching point and the second teaching point to the other one of the first teaching point and the second teaching point. During the first operation, the determination whether the end effector passes the installation position is inhibited, and the end effector is not stopped.

According to this configuration, the robot control device according to the present disclosure does not determine whether the end effector passes the installation position, and does not stop the end effector during the first operation. As a result, the robot control device according to the present disclosure can promptly transfer the substrate while holding the substrate.

The end effector may be inhibited to decelerate at or near the installation position during the first operation.

According to this configuration, the robot control device according to the present disclosure can further promptly transfer the substrate while holding the substrate.

For example, the positional information on the installation position may be stored beforehand by teaching, and at least either one of the first teaching point and the second teaching point may be derived based on the distance from the installation position.

A robot according to the present disclosure includes the robot control device having any one of the configurations described above, the robotic arm, and the end effector.

According to this configuration, since the robot according to the present disclosure is provided with the robot control device having any one of the configurations described above, the robot can promptly transfer the substrate while holding the substrate.

The end effector may have the base-end part connected to the tip end of the robotic arm, and the two tip-end parts branching from the base-end part so as to extend to the tip-end side. The first teaching point and the second teaching point may be set such that the installation position passes through between the two tip-end parts when the end effector passes the installation position during the first operation.

According to this configuration, the robot according to the present disclosure can certainly transfer the substrate while holding the substrate with the simple structure.

The robot control method according to the present disclosure is the method for controlling operation of the robot configured to transfer the substrate while holding the substrate. The robot includes the robotic arm having at least one joint axis, and the end effector provided to the tip end of the robotic arm and configured to hold the substrate. The robot is disposed adjacent to the installation position at which the substrate is placed. The substrate becomes in the first state where the end effector holds the substrate and the substrate is not placed at the installation position, when the end effector positions at the first teaching point above the installation position. The substrate becomes in the second state where the end effector does not hold the substrate and the substrate is placed at the installation position, when the end effector positions at the second teaching point below the installation position. The method includes the steps of positioning the end effector at either one of the first teaching point and the second teaching point (First Step), and switching between the first state and the second state by causing the robot to perform the first operation to move the end effector from the one of the first teaching point and the second teaching point to the other one of the first teaching point and the second teaching point, and not determining whether the end effector passes the installation position, and not stopping the end effector during the first operation (Second Step).

According to this configuration, the method of controlling the robot according to the present disclosure does not include determining whether the end effector passes the installation position, or stopping the end effector during the first operation. As a result, the robot control method according to the present disclosure can promptly transfer the substrate while holding the substrate.

What is claimed is:

1. A robot control device configured to control operation of a robot configured to transfer a substrate while holding the substrate, the robot comprising:
    a robotic arm having at least one joint axis; and
    an end effector provided to a tip end of the robotic arm and configured to hold the substrate,
    wherein the robot is disposed adjacent to an installation position at which the substrate is placed,
    wherein the substrate becomes in a first state where the end effector holds the substrate and the substrate is not placed at the installation position, when the end effector positions at a first teaching point above the installation position,
    wherein the substrate becomes in a second state where the end effector does not hold the substrate and the substrate is placed at the installation position, when the end effector positions at a second teaching point below the installation position,
    wherein the robot control device switches between the first state and the second state by causing the robot to perform a first operation to move the end effector from either one of the first teaching point and the second teaching point to the other one of the first teaching point and the second teaching point, and wherein the robot control device is inhibited to determine whether the end effector passes the installation position, and to stop the end effector during the first operation.

2. The robot control device of claim 1, wherein the robot control device is inhibited to decelerate the end effector at or near the installation position during the first operation.

3. The robot control device of claim 1, wherein positional information on the installation position is stored beforehand by teaching, and the robot control device derives at least either one of the first teaching point and the second teaching point based on a distance from the installation position.

4. A robot, comprising:
the robot control device of claim 1;
the robotic arm; and
the end effector.

5. The robot of claim 4, wherein the end effector includes a base-end part connected to a tip end of the robotic arm, and two tip-end parts branching from the base-end part so as to extend to a tip-end side, and wherein the first teaching point and the second teaching point are set such that the installation position passes through between the two tip-end parts when the end effector passes the installation position during the first operation.

6. A robot control method for controlling operation of a robot configured to transfer a substrate while holding the substrate, the robot including:

a robotic arm having at least one joint axis; and an end effector provided to a tip end of the robotic arm and configured to hold the substrate, wherein the robot is disposed adjacent to an installation position at which the substrate is placed, wherein the substrate becomes in a first state where the end effector holds the substrate and the substrate is not placed at the installation position, when the end effector positions at a first teaching point above the installation position, and wherein the substrate becomes in a second state where the end effector does not hold the substrate and the substrate is placed at the installation position, when the end effector positions at a second teaching point below the installation position, the method comprising the steps of:

positioning the end effector at either one of the first teaching point and the second teaching point; and switching between the first state and the second state by causing the robot to perform a first operation to move the end effector from the one of the first teaching point and the second teaching point to the other one of the first teaching point and the second teaching point, and not determining whether the end effector passes the installation position, and not stopping the end effector during the first operation.

* * * * *